United States Patent [19]

Braslau

[11] Patent Number: 4,605,893

[45] Date of Patent: Aug. 12, 1986

[54] CONTACTLESS MEASUREMENT OF ELECTRICAL PROPERTIES OF WAFER SHAPED MATERIALS

[75] Inventor: Norman Braslau, Katonah, N.Y.

[73] Assignee: International Business Machines Corporation, Armonk, N.Y.

[21] Appl. No.: 647,785

[22] Filed: Sep. 6, 1984

[51] Int. Cl.[4] ............................................ G01R 27/04
[52] U.S. Cl. ............................ 324/58.5 B; 333/248;
29/574; 324/58.5 R; 324/158 P
[58] Field of Search ..................... 333/248, 238, 227;
29/574, 569 R; 324/58.5 R, 58.5 A, 58.5 B, 58.5 C, 158 R, 158 D, 158 P

[56] References Cited

U.S. PATENT DOCUMENTS

| | | | |
|---|---|---|---|
| 3,034,046 | 5/1962 | Sasaki | 324/58.5 A |
| 3,212,000 | 10/1965 | Allerton et al. | 324/62 |
| 3,258,721 | 6/1966 | LaRussa et al. | 333/11 |
| 3,628,135 | 12/1971 | Reed | 324/58.5 A |
| 3,939,415 | 2/1976 | Terasawa | 324/158 D |
| 4,087,745 | 5/1978 | Kennedy, Jr. et al. | 324/58 B |
| 4,123,702 | 10/1978 | Kinanen | 324/58.5 A |
| 4,319,185 | 3/1982 | Hill | 324/58.5 A |
| 4,507,602 | 3/1985 | Aguirre | 324/58.5 R |
| 4,514,680 | 4/1985 | Heikkila | 324/58.5 A |

FOREIGN PATENT DOCUMENTS 0832430  5/1981  U.S.S.R. ......................... 324/58.5 A

OTHER PUBLICATIONS

Molnar et al, J. Electrochem. Soc.: Solid-State Science & Tech. 25, Aug. 8, 1978, "Evaluation of S- and Se-Implanted GaAs by Contactless etc.", p. 1318.
Fortini et al, J. Appl. Phys., vol. 44, No. 12, Dec. 1983, "Determination of Mobility by 8-mm Microwave Magnetoreflectivity in Semiconductors", p. 5489.
Pozhela et al, Defektoskipiya, No. 9, Sep. 1980, "Finding the Mobility and Concentration of Charge Carriers in Semiconductors by Contactless Means", p. 647.
Bichara et al, IEEE Trans. on Instrumentation and Measurement, Dec. 1964, "Resistivity Measurement of Semiconducting Epitaxial Layers etc.", p. 323.
Dixon, Jr. et al, J. Appl. Phys., vol. 45, No. 6, Jun. 1974, p. 2570, "Semiconductor Conductivity Measurements Using a High-Sensitivity Microwave Technique".
"Dynamical Conductivity Measurements of Surface Space Charge Layers" by Stallhofer & Koch, H. Feskorper Probleme XV (Queines Ed., p. 79, (1975)).
Jacobs et al, Proceedings of the IRE, May 1961, p. 928, "Electrodeless Measurement of Semiconductor Resistivity at Microwave Frequencies".
Bryant et al, The Review of Scientific Instruments, vol. 36, No. 11, 1614-1617, Nov. 1965, "Noncontact Technique for the Local Measurement of Semiconductor etc.".
Srivastava et al, The Review of Scientific Instruments, vol. 42, No. 12, Dec. 1971, p. 1793, "Conductivity Measurements of Semiconductors by Microwave etc.".
Runyan, Semiconductor Measurements and Instrumentation, McGraw-Hill Book Co., 1975, p. 84.
Ragan, Microwave Transmission Circuits, pp. 193-200, 218, 1948.
Rees, J. Phys. C:Solid St. Phys., 1970, vol. 3, p. 965, "The Numerical Analysis of Semiclassical Transport Problems".
Boardman et al, Phys. Stat. Sol. (a) 4, 133, 1971, "Monte Carlo Determination of Hot Electron Galvanomagnetic Effects in Gallium Arsenide", p. 133.

Primary Examiner—Reinhard J. Eisenzopf
Assistant Examiner—Jose M. Solis
Attorney, Agent, or Firm—Alvin J. Riddles

[57] ABSTRACT

Absolute electrical parameter values using reflected microwaves are achieved through measurement of a sample that completely fills the cross section of the waveguide. A test sample holder for a wafer shaped sample employs a choke flange type plate and a backing plate for the wafer. Semiconductor sheet resistivity and mobility values are measured.

13 Claims, 4 Drawing Figures

CONTACTLESS MEASUREMENT OF ELECTRICAL PROPERTIES OF WAFER SHAPED MATERIALS

DESCRIPTION

1. Technical Field

The technical field of the invention is in the measurement of the various electrical parameters of wafer-shaped materials.

In the fabrication of electrical functional components, large arrays of circuitry are generally assembled on or constructed in the surface of a member that is shaped like a wafer in that it has a thickness dimension that is small in comparison to essentially parallel large surface areas. As the density and complexity of the functional components has increased, the fabrication has reached a level requiring many interdependent steps and frequently it is efficient to have partial fabrication of layers and intermediate products from different locations.

In the semiconductor technology which is a particularly stringent example, arrays of circuitry are made in layers of about 3000 Angstroms thick on a monocrystalline wafer of about 5 centimeters in diameter and about 0.5 millimeters thick. The processing and performance of the arrays is dependent on stringent electrical parameters in the wafer, and particularly on the layers thereon.

2. Background Art

In semiconductor technology the more critical electrical parameters are carrier mobility and sheet resistance of layers from which components are fashioned. These parameters have traditionally been measured by the Hall effect. This technique requires sacrificing a portion of the material to serve as a test sample and the test sample requires time-consuming preparation operations of shaping and fabrication of contacts.

There has been effort in the art to provide a simple, contactless testing approach that could be applied both before and during processing. One method, which measures only sheet resistance, is eddy current loading of a VHF oscillator tank circuit.

The most promising principle studied in the semiconductor art over a long period of time for contactless testing has been the use of microwaves reflected from the semiconductor member. One example of this technology is described in U.S. Pat. No. 4,087,745 wherein a semiconductor sample, smaller than the waveguide cross section, is placed in an adjustably short circuited waveguide. A large variable magnetic field is employed so that the mobility electrical property can be determined by reflected microwave energy.

DISCLOSURE OF THE INVENTION

Figure 1:
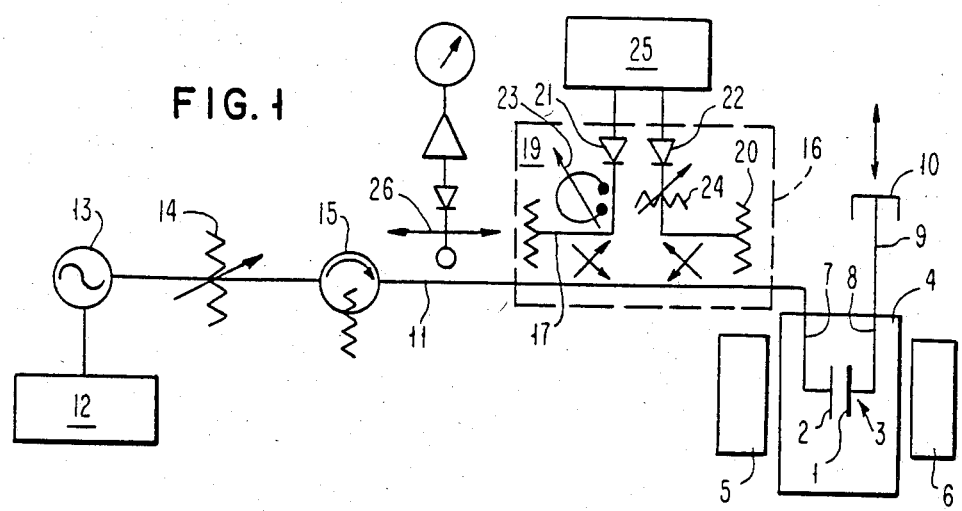
FIG. 1 is a schematic illustration of the waveguide measurement testing apparatus of the invention.

The invention is the achieving of absolute as contrasted with calibrated electrical parameter measurements using reflected microwave signals by filling the entire microwave waveguide cross-section with the test sample. The test sample holder permits an entire wafer to serve as the test sample without separating out a portion. The reflected signal in zero magnetic field is related to the sheet resistance; the change in reflected signal with magnetic field is related to the mobility.

The achieving of the capability to provide absolute electrical parameter measurements is the combination of a test sample structure that physically accommodates a wafer but electrically compensates for the opening in the waveguide, accompanied by an adjustment in the position of a backing short circuit which compensates for the reactive effect of the presence of the substrate wafer on the reflected signal.

The apparatus accommodates a sample shape that is standard in semiconductor technology. It gives absolute, direct and hence short turnaround time responses. It is nondestructive and contactless. The apparatus accommodates temperature variations for measurements into the liquid nitrogen range.

While for clarity of explanation the description will be focused on the measurement of the sheet resistance and mobility electrical parameters of semiconductors, it will be apparent to one skilled in the art in the light of the principles involved that other material parameters, such as oxide quality in any layer where common physical principles apply, may be readily characterized.

The following is a generalized description of the principles involved.

The wave impedance $Z_0$ of a conventional waveguide in ohms is given by Equation 1.

$$Z_0 = \frac{377}{\sqrt{1 - \left(\frac{f_0}{f}\right)^2}} \qquad \text{Equation 1}$$

where
  $f$ is the operating frequency
  $f_0$ is the cutoff frequency for the waveguide, and
  377 ohms is the impedance of free space.

The voltage reflection coefficient $\Gamma$ for an impedance $Z$ terminating the waveguide is given by Equation 2.

$$\Gamma = \frac{(Z - Z_0)}{(Z + Z_0)} \qquad \text{Equation 2}$$

When a uniform resistive film of sheet resistance R (ohm square$^{-1}$), when backed by an adjustable short circuit, the admittance electrical property $Z^{-1}$ will be the sum of the resistive film conductance electrical parameter $R^{-1}$ and the susceptance electrical property of the shorted line.

When the length of a shorted line is adjusted to give zero susceptance corresponding to a quarter wavelength, the line is then terminated by an impedance $Z$ which is equal to R. A test sample positioned at this point will provide a reflected microwave signal that is an absolute measure of sheet resistance.

The relationship of reflection coefficient to sheet resistance has two branches, one on either side of $Z_0$ which produces a phase ambiguity that can be resolved by using a slotted line detector to sense the phase of the standing wave.

Mobility, symbolized $\mu$ is established by the slope of a line of values of the expression in Equation 3 plotted against the magnetic field intensity.

$$\sqrt{\frac{R}{R_{B=0}} - 1} = \mu B \qquad \text{Equation 3}$$

where
R is the sheet resistance of the sample, and
B is the magnetic field intensity.

In correlating the reflected microwave properties accommodation is employed based on the fact that real samples are layers mounted on a thicker non-conducting substrate which behaves as a series reactance in the waveguide. The position of the adjustable short can be arranged to compensate for this additional reactance and permit identifying the resistance of the layer under test.

The reflection coefficient as a function of short position or distance from the test location to the short circuit termination shows a distinct minimum when the terminating impedance is purely resistive.

These parameters hold true so long as the property which measures the attenuation of the microwave signal, known as skin depth, symbolized $\delta$, in the resistive film, is large compared to its thickness. This condition is easily satisfied for the semiconductor layers that are of practical interest at conventional microwave frequencies.

In accordance with the invention, it has been found that a full semiconductor wafer may be inserted in and completely across the waveguide if the severe discontinuity in the wave propagation properties is compensated through the use of a special wafer holder. The wafer holder of the invention provides wafer retaining and positioning capability together with waveguide alignment maintenance and wave propagation discontinuity compensation. The wafer holder of the invention has parallel backing and discontinuity compensating plates separated by a space somewhat greater than a wafer thickness. The discontinuity compensation plate employs the principles in the art known as the choke flange which introduces, in essence, a half wavelength series branching line which presents zero series impedance to the main waveguide. With the axis of the waveguide preserved in the wafer holder of the invention, the flanges may be separated by a distance, which for most practical structures, is sufficient for the insertion of semiconductor wafer thicknesses.

Thus, the wafer holder structure of the invention permits a wafer which is larger than the waveguide cross-section to be held against the flat flange and the propagating mode to be preserved across the section. The portion of the wafer within the guide may be used as a sample in identifying the electrical parameters while the part of the wafer within the radial series branching line of the choke flange type plate acts to slightly modify the waveguide wavelength in that section. However, at near midband of the dominant mode the modification is almost undetectable.

The apparatus, with the exception of the wafer holder, involves components that are standard in the microwave art.

Referring to FIG. 1 there is shown a schematic diagram of the measuring apparatus of the invention. In the apparatus wafer 1 is positioned between parallel plates 2 and 3 in a wafer holder 4 within the magnetic field between two magnet pole pieces 5 and 6. The wafer holder 4 has waveguide main portion inlet 7 and waveguide termination outlet 8 elements. The portion 9 of the waveguide beyond the wafer holder 4 is terminated in an adjustable short 10. The waveguide 11 is supplied by a Klystron 13 connected to a square wave modulated power supply 12. The combination of the square wave modulated power supply 12 and Klystron 13 provide controlled duty cycle microwave amplitude modulation required for the operation of the ratiometer signal detector. An adjustable attenuator 14 for level setting and a circulator 15 to suppress back reflections are provided. A reflectometer labelled 16 is provided which samples a portion of the driving power of the waveguide 11 coming from Klystron 13 and compares it with a portion of the reflected power from the wafer sample 1.

The reflectometer is standard in the art with each directional coupler branch 17 and 18 terminated in matched impedances 19 and 20 in one propagation direction and in diode detectors 21 and 22 in the opposite direction.

A frequency detector 23 is provided to establish the value of the term f of equation 1.

A level setter 24 is provided to, in combination with level setter 14, insure proper operating power levels so that diode detectors 21 and 22 operate in square law condition, that is, rectified voltage is proportional to incident power.

The ratio of the driving power and reflected power levels from diodes 21 and 22 is provided by ratiometer 25.

A standard slotted guide detector probe 26, including a diode and voltmeter as not numbered elements is provided, to be moved along the axis of the waveguide 11 in order to determine maxima and minima of the standing wave pattern in the line for use in determining the phase of the reflection coefficient.

Figure 2:
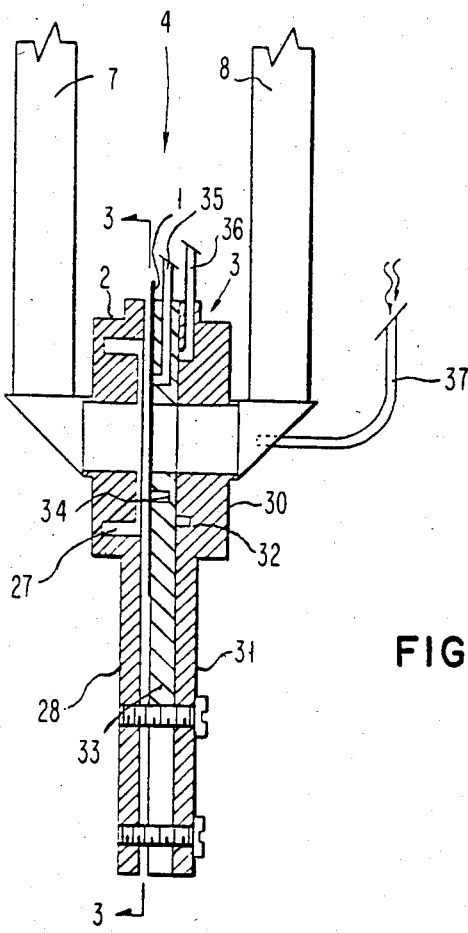
FIG. 2 is a cross-sectional detail of the wafer holder in the apparatus of FIG. 1.

Referring next to FIG. 2, a cross-section of the wafer holder 4 is shown. In the wafer holder the wafer 1 is positioned between discontinuity accommodating flange 2 and backing flange 3. The flange 2 has a groove 27 that provides the choke flange properties well known in the art and also has an extended portion 28 that provides waveguide alignment between the portions 7 and 8 across the wafer accommodating gap and also provides thermal transfer for low or different temperature testing when immersed in suitable coolant.

Maintenance of waveguide alignment and wafer retention during testing is achieved by providing the backing plate 3 in two pieces with chambers for separate vacuum application. Plate 3 has a support member 30 with an extended portion 31 serving the functions of element 28 of plate 2 and having a vacuum chamber 32 which serves to hold in alignment wafer backing member 33 with a central waveguide opening. Vacuum chamber 34 serves to hold in poisition wafer 1. Separate vacua applied to ports 35 and 36 respectively will retain the wafer 1 and the plate 33 in alignment.

An optical fiber 37 is provided to permit illumination normal to the wafer 1 surface. This feature is employed where some semiconductor layers change properties under illumination.

The structural features of the wafer holder 4 wherein the waveguide inlet 7 and outlet 8 are close together and parallel, permit insertion in magnetic fields without excessive pole piece separation, extended portions 28 and 31 for thermal conductivity and alignment facilitation and the use of standard components for the adjustable short 10 since it is not confined between the pole pieces and is not subject to low temperatures.

Figure 3:
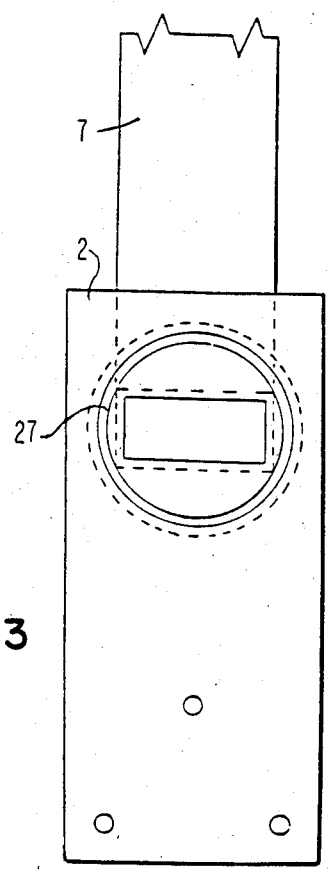
FIG. 3 is a further section along the line 3—3 of the wafer holder in FIG. 2.

Referring to FIG. 3, the view along section 3—3 of FIG. 2 provides perspective on the relative position of the waveguide 7, the flange 2 and the groove 27.

The wafer sample is put into place between the plates 2 and 3 and the short circuit 10 is adjusted to give a minimum in the reflection coefficient. The value of the reflection coefficient at this point gives the sheet resistance. The reflection coefficient as a function of static magnetic field is measured and the sheet resistance as a function of magnetic field is fit into an expression known in the art as the Drude relation by the method of least squares. The Drude relation is shown as Equation 4 where $\mu$ is the mobility, the subscript zero indicates zero magnetic field value, and B is the external field value.

$$\frac{\sigma}{\sigma_0} = \frac{R_0}{R} = \frac{1}{1 + (\mu B)^2} \quad \text{Equation 4}$$

where $\sigma$ is conductivity,

R is sheet resistance 0 indicates zero magnetic field value.

Figure 4:
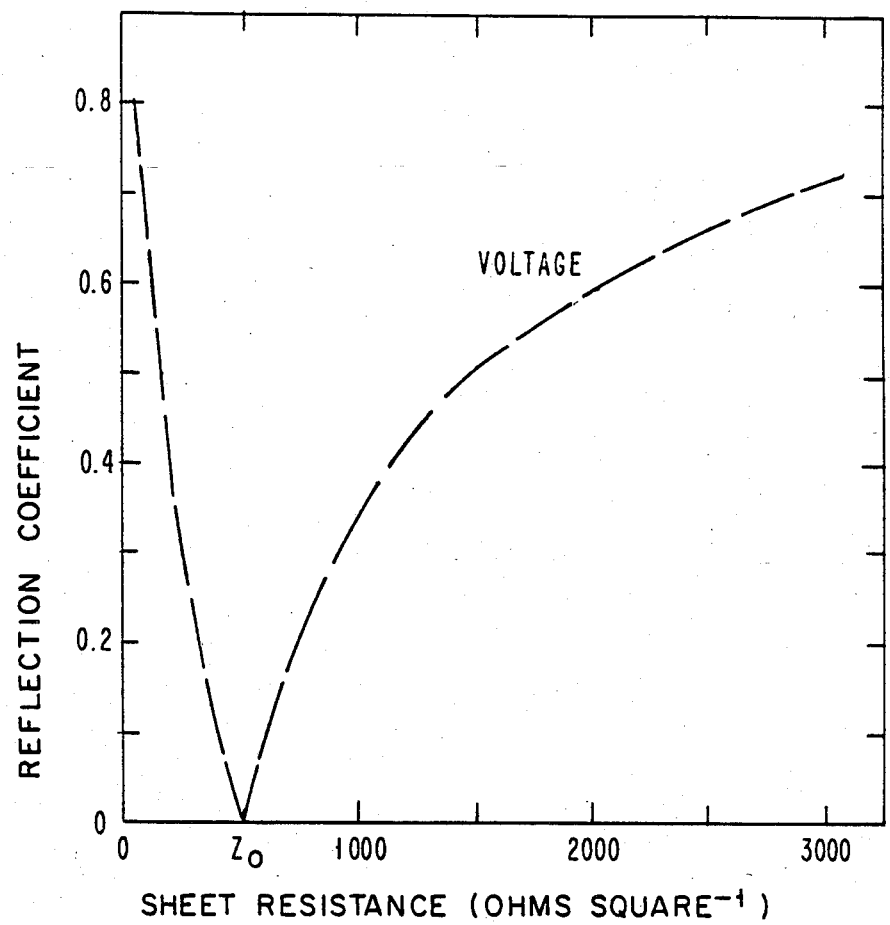
FIG. 4 is a graph illustrating the relationship of reflection coefficient with the sheet resistance electrical parameter.

Referring next to FIG. 4, which is a graph of Equation 2, showing the relationship of the magnitude of the reflection coefficient to the sheet resistance of the sample. Since the response curve in FIG. 4 goes to a minimum and increases, a determination must be made in connection with the measurement as to which branch of the curve the reading takes place through measurement of its phase. Since the response is double valued, the initialization of the measurement is made by replacing the sample with a metal plate and the reflection coefficient is set to 1. The slotted line detector 26 is moved to indicate a minimum at the standing wave. This defines the phase of the short caused by the metal plate. Points on the branch of the curve in FIG. 4 closer to the origin will have this phase and the slotted line signal will be a local minimum.

Points on the higher branch will be 90° out of phase and the slotted line detector signal will be a local maximum. The minimum which has the value zero occurs for sheet resistance value equal to $Z_0$. This procedure removes the ambiguity with respect to which branch is represented by the reading at the reflectometer 25.

Alternatively, as the sample's resistance always increases with magnetic field, the reflection coefficient will always decrease with increasing field for samples with sheet resistance on the branch below $Z_0$ shown in FIG. 4 and increases for samples with values higher than $Z_0$.

When the function defined on the left side of Equation 3 is plotted against magnetic field the slope of the line taken on a number of points will be the magnetoconductive mobility.

In order to cool the sample 1, the portions 28 and 31 in FIG. 2 are placed in a simple stainless steel cup of square cross section covered by foam insulation which is filled with liquid nitrogen and raised so the level is slightly below the waveguide cross-section. Conduction and convection operate to reduce the temperature of the sample down to the range desired. Conduction losses are minimized by making the waveguide portions 7 and 8 thin walled stainless steel in the region of the sample holder. There will be a slight temperature gradient, about 4° Kelvin, across a mounted sample and the mean temperature under equilibrium conditions will be about 85° Kelvin. The cooling of a mounted sample takes about 4 minutes.

Since the portion of a substrate below the skin depth has known reactance properties, the system can handle a sample with various layers.

This is of particular value for GaAlAs GaAs heterojunctions wherein there is an electron gas at the interface of a surface, the mobility of which is of interest in the vicinity of liquid nitrogen temperatures. Shunt conductance in the doped GaAlAs is also sensed by the microwave signal. At low temperatures the zero magnetic field sheet resistance of the electron gas is low enough that the parallel combination is close to this lower valve. For this type of heterojunction, the temperature dependence of electron mobility is less than 1% per degree so that the measurement of the technique underestimates the two-dimensional electron gas mobility by less than 10%.

Sheet resistance in the range of 50 to 3,000 ohms per square can be determined. The required pole piece separation to insert the sample holder 4 of FIG. 1 is about 7 cm. With typical iron core electromagnets this limits the attainable field to about 0.5 Tesla (5 Kg). Thus, under these constraints the smallest mobility that can be measured is about 3,000 centimeters square per volt second. The value obtained is an average over the waveguide cross-section. Where multiple layers are measured, consideration need be given to shunt conduction in adjacent layers.

Measurements are usually automatically analysed and printed by computer so that immediate turnaround with respect to off the shelf wafers can be conducted with the apparatus.

BEST MODE FOR CARRYING OUT THE INVENTION

The apparatus of FIG. 1 is assembled from standard components and the components, their dimensions, operating conditions are set forth in Table 1. A simple microwave system has been described that measures electrical parameters, such as sheet resistance and mobility in layers on wafer-shaped materials. It is non-destructive, contactless, absolute, and fast.

TABLE 1

Waveguide 11- WR-90(X Band) cross section 1.01 × 2.29 cm, (0.4 × 0.9 in)

Cut off frequency 6.557 GHz

Reflectometer 16 —20 db directional couplers sensing 0.01 of power of forward and reflected waves with ratio displayed on Hewlett-Packard 416 B Ratiometer.

Klystron 13—Varian X-13 operated at 10.1 Ghz so that $Z_0 = 507$ ohms

Power supply 12—PRD 809 square wave amplitude modulated at 1 Khz

Magnet 5-6—7 cm gap maximum field 0.5 Tesla with 1.2 amp power supply

Wafer holder gap—up to the vicinity of 2 millimeters.

Having thus described my invention, what I claim as new and desire to secure by Letters Patent is:

1. Electrical measurement apparatus comprising in combination a waveguide having a source of microwave power applied at one portion thereof, and a short circuit termination at a second separated portion thereof, means for insertion of a material with substrate to be measured across the entire cross section of said waveguide, said means being positioned at a location in said waveguide sufficiently adjacent to said short circuit termination to compensate for the reactance of said substrate and between said short circuit and said source of microwave power, said insertion means having means for compensating for a change in waveguide impedance produced by said insertion means, and microwave relfection comparison means located on said waveguide at a position intermediate the location of said insertion means and said source of microwave power.

2. The apparatus of claim 1 wherein said microwave reflection comparison means compares a portion of at least one of microwave power and voCltage propagating along said waveguide from said source of microwave power toward said material at said insertion means with a portion of at least one of microwave power and voltage reflected from said material propagating along said waveguide from said material toward said source of microwave power.

3. The apparatus of claim 1 including magnetic field means surrounding said insertion means.

4. The apparatus of claim 1 including magnetic field means surrounding said measurement sample insertion means.

5. The apparatus of claim 1 wherein said insertion means includes a wafer width slot across said waveguide and means for compensating for the discontinuity produced by said gap.

6. The apparatus of claim 5 wherein said means for compensating for said gap discontinuity involves a choke flange type plate.

7. Apparatus for the measurement of electrical properties of a wafer shaped material comprising in combination, a microwave guide,
means applying a source of microwave power at a first location in said microwave guide,
means terminating said microwave guide in a short circuit at a second location and separated from said first location,
an opening in said microwave guide capable of accommodating across the entire cross section of said microwave guide at least a portion of said wafer shaped material,
said opening being positioned a wafer shaped material substrate reactance compensation distance from said short circuit, and
means for compensating for the change in impedance in said waveguide produced by said opening.

8. The apparatus of claim 7 including adjustment means for the distance of said short circuit from said opening.

9. The apparatus of claim 8 wherein said opening is a wafer accommodating slot through said waveguide, having first and second parallel plates each surrounding said waveguide at said slot and separated by a wafer thickness accommodating dimension, said first plate on the side of said slot away from said short circuit having a microwave guide gap impedance compensating choke flange dimension groove therein.

10. Electrical parameter measurement apparatus for wafer shaped material comprising in combination
a waveguide,
said waveguide having
a source of microwave power applied at one portion thereof and
a short circuit termination at a second portion thereof,
a wafer holder,
said wafer holder having
a source waveguide portion connected to said microwave source portion of said waveguide,
a termination waveguide portion
positioned at a substrate reactance compensating distance from said short circuit termination and further
positioned parallel to and separated from said source portion and connected to said short circuit termination portion of said waveguide,
a wafer retention portion aligning said source and termination portions in a section perpendicular to said source and termination portions,
said section having
a wafer thickness slot thereacross,
a wafer supporting and slot discontinuity compensating member with a thermal and alignment retention portion extending therefrom surrounding the portion of the waveguide at the slot in said section adjacent said source portion, and
a wafer supporting member with a thermal and alignment retention portion extending therefrom surrounding the portion of the waveguide at the slot in said section adjacent said termination portion,
magnetic field means surrounding said wafer retention means, and
means comparing a portion of at least one of microwave power and voltage propagating along said waveguide from said source of microwave power toward said wafer rentention section with a portion of at least one of microwave power and voltage reflected from a wafer in said wafer retention section propagating along said waveguide from said wafer retention section toward said source of microwave power.

11. A wafer holder for reflected microwave electrical parameter measurement of a wafer shaped measurement sample comprising in combination
a microwave source portion of a waveguide,
a termination portion of said waveguide parallel with said source portion,
a measurement sample section perpendicular to said source and said termination portions aligning said portions and having a wafer thickness slot opening across said section,
a first wafer supporting member having a slot opening produced impedance change compensating groove surrounding said waveguide positioned around said waveguide at said slot adjacent said source portion,
a second wafer supporting member positioned around said waveguide at said slot adjacent said termination portion.

12. The wafer holder of claim 11 wherein each said wafer supporting member has an extended temperature conducting and alignment retaining protrusion.

13. The wafer holder of claim 12 including separate alignment retaining and wafer retaining vacuum means.

* * * * *